US007178230B2

(12) United States Patent
Tsai

(10) Patent No.: US 7,178,230 B2
(45) Date of Patent: Feb. 20, 2007

(54) METHOD OF MANUFACTURING A METAL HOUSING OF AN ELECTRICAL CONNECTOR

(76) Inventor: Chou Hsuan Tsai, 15F, No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 0 days.

(21) Appl. No.: 11/052,962

(22) Filed: Feb. 7, 2005

(65) Prior Publication Data

US 2006/0079114 A1 Apr. 13, 2006

(30) Foreign Application Priority Data

Sep. 30, 2004 (TW) .............................. 93129566 A

(51) Int. Cl.
*H05K 3/30* (2006.01)

(52) U.S. Cl. ...................... 29/835; 29/592.1; 29/602.1; 29/844; 83/29; 83/35; 83/36; 83/50; 361/816; 361/818; 439/79; 439/567; 439/597; 439/607

(58) Field of Classification Search ............... 29/592.1, 29/835, 844; 361/816, 818; 439/79, 567, 439/597, 607–610; 83/29, 35, 36, 50
See application file for complete search history.

(56) References Cited

U.S. PATENT DOCUMENTS 4,389,080 A * 6/1983 Clark et al. ................... 439/62
5,765,275 A * 6/1998 Obara ..................... 29/603.03
6,205,831 B1 * 3/2001 Adey et al. .................... 72/47

FOREIGN PATENT DOCUMENTS

JP 58077720 A * 5/1983

OTHER PUBLICATIONS

"Resistance buildup in electrical connectors due to fretting corrosion of rough surfaces"; Bryant, M.D.; Electrical Contacts, 1993., Proceedings of the Thirty-Ninth IEEE Holm Conference on Sep. 27-29, 1993; pp. 178-190.*

* cited by examiner

*Primary Examiner*—Paul D. Kim
(74) *Attorney, Agent, or Firm*—Pro-Techtor Int'l Services

(57) ABSTRACT

An electrical connector having a seamless metal housing and a method for manufacturing the same. The electrical connector includes a plastic base and a metal housing. The housing shields a connection portion of the plastic base and is integrally formed with a top surface and a plurality of circumferential surfaces to define a chamber having an opened bottom end. At least one surface among the circumferential surfaces and the top surface is formed with an opening to expose the connection portion of the plastic base. No seam is formed between any adjacent two surfaces among the top surface and the circumferential surfaces.

7 Claims, 7 Drawing Sheets

METHOD OF MANUFACTURING A METAL HOUSING OF AN ELECTRICAL CONNECTOR

BACKGROUND OF THE INVENTION

1. Field of the Invention

The invention relates to an electrical connector, and more particularly to an electrical connector having a seamless metal housing and a method for manufacturing the same.

2. Description of the Related Art

FIG. 1 shows a conventional electrical connector (jack) with multiple connection points. The connector includes a plastic base 10 and a metal housing 20. A plurality of terminals is disposed in the plastic base 10, and three connection portions 11 are formed on the front end of the plastic base 10. The metal housing 20 covering the plastic base 10 is integrally formed with a top surface 21, a front surface 22, a rear surface 23, and two side surfaces 24. The top surface 21 and the rear surface 23 respectively have two folding edges 25 and 26 at two sides. The front surface 22 is formed with three openings 27 through which the connection portions 11 of the plastic base 10 are exposed. The metal housing 20 is formed by cutting a metal plate into the shape of FIG. 2 and then folding the shape of FIG. 2 into the metal housing with an opened bottom end.

The prior art connector has the following drawbacks.

1. Because the metal housing 20 is formed by cutting the metal plate into the developed shape for forming the housing with a chamber, a lot of waste products are generated, the material consumption is great, and the consumed time is long.

2. The top surface 21 and each of the two side surfaces 24 are only in contact with each other without connection, so seams exist therebetween. Although the folding edges 25 for covering the seams are provided to enhance the sealing effect, the seams cannot be completely sealed. Similarly, seams also exist between the rear surface 23 and the two side surfaces 24 and the folding edges 26 for covering the seams are also provided, so the overall sealing effect still has to be enhanced.

3. The appearance is adversely influenced because of the seams and overlapped portions.

SUMMARY OF THE INVENTION

It is therefore an object of the invention to provide an electrical connector having a seamless metal housing and a method for manufacturing the same, wherein the connector has a better shielding effect, reduces the electrical interference, and glorifies the overall appearance.

Another object of the invention is to provide an electrical connector having a seamless metal housing and method for manufacturing the same capable of saving the material and facilitating the manufacturing processes.

To achieve the above-mentioned object, the invention provides an electrical connector having a seamless metal housing. The electrical connector includes a plastic base and a metal housing. The housing shields a connection portion of the plastic base and is integrally formed with a top surface and a plurality of circumferential surfaces to define a chamber having an opened bottom end. At least one surface among the circumferential surfaces and the top surface is formed with an opening to expose the connection portion of the plastic base. No seam is formed between any adjacent two surfaces among the top surface and the circumferential surfaces.

According to the above-mentioned connector, it is possible to improve the shielding effect, reduce the electrical interference, glorify the overall appearance, save the material, and facilitate the manufacturing processes.

DETAILED DESCRIPTION OF THE INVENTION

Figure 1:
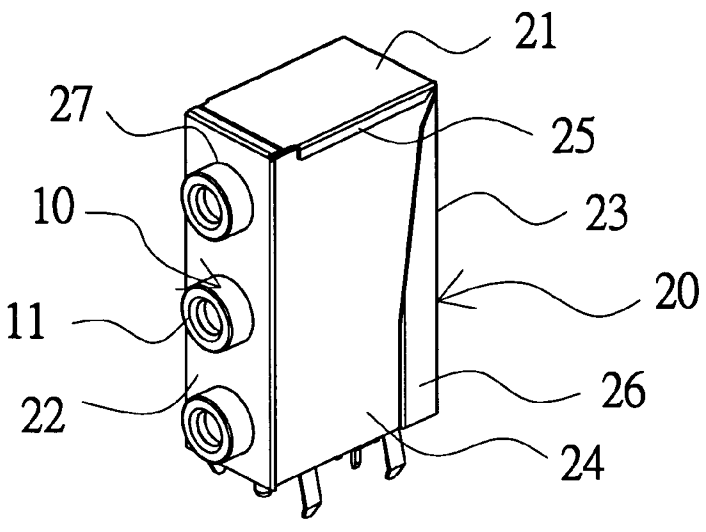
FIG. 1 (Prior Art)
FIG. 1 is a pictorial view showing an electrical connector with multiple connection points.
Figure 2:
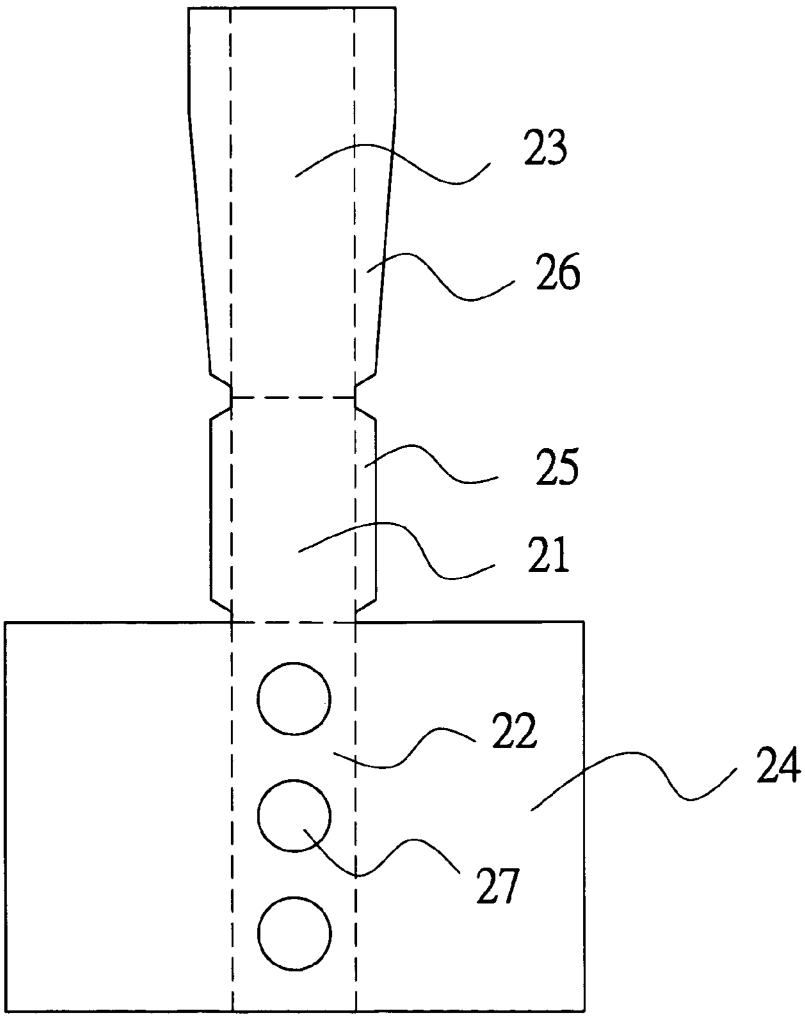
FIG. 2 (Prior Art)
FIG. 2 is a developed plane view showing a metal housing for the connector of FIG. 1.
Figure 3:
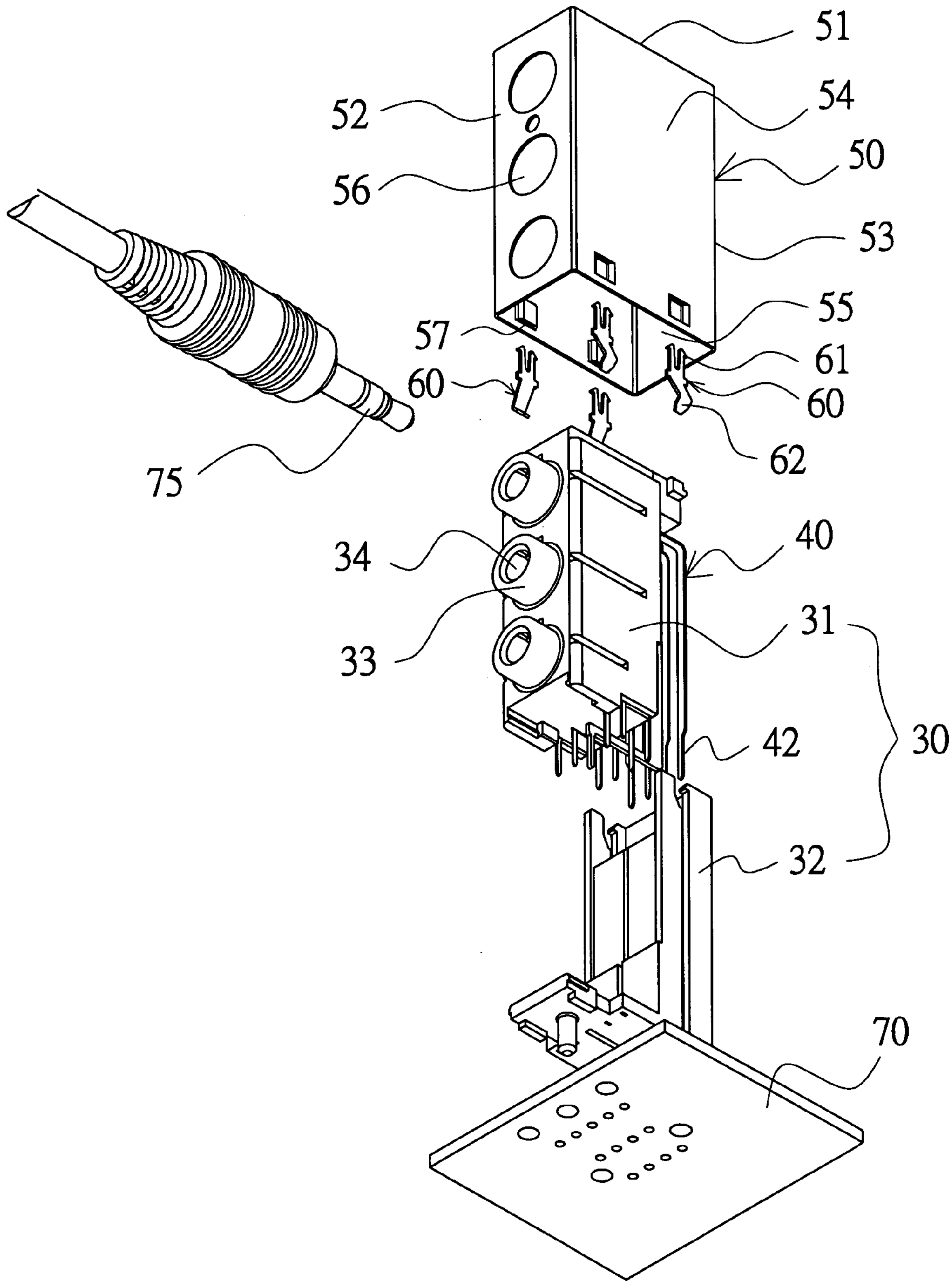
FIG. 3 is a pictorially exploded view showing a connector according to a first embodiment of the invention.
Figure 4:
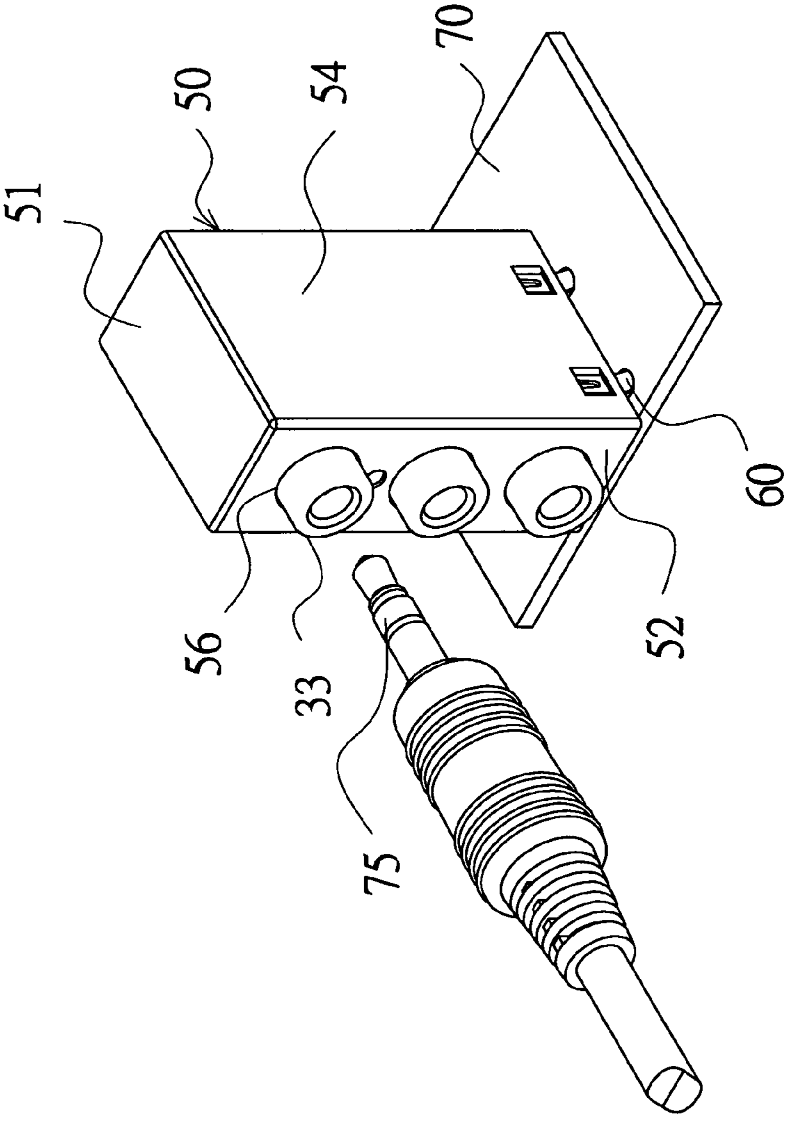
FIG. 4 is a pictorially assembled view showing the connector according to the first embodiment of the invention.

Referring to FIGS. 3 and 4, the electrical connector (jack) of the embodiment includes a plastic base 30, a plurality of terminals 40, a metal housing 50 and a plurality of hooking members 60.

The plastic base 30 includes a main seat 31 and a sub-seat 32 for covering the rear end and bottom end of the main seat. The front end of the main seat 31 is formed with three cylindrical connection portions 33 that are spaced apart and aligned. Each connection portion 33 has a hole 34 into which a connection head 75 of a signal line is inserted for connection.

The terminals 40 are arranged on the main seat 31. Each terminal 40 has a contact in the hole 34 of the main seat 31, and a pin 42 extending out of the main seat 31.

The metal housing 50 made of the aluminum material shields the plastic base 30, and is integrally formed with a top surface 51, a front surface 52, a rear surface 53 and two side surfaces 54, all of which define a chamber 55 with an opened bottom end. No seam is formed between any two adjacent surfaces. Each of the plurality of circumferential surfaces 52 to 54 is connected to two corresponding circumferential surfaces of the plurality of the circumferential surfaces 52 to 54 to form a closed polygonal shape. In addition, the front surface 52 has three circular openings 56 such that the connection portions 33 of the plastic base 30 extend out of the metal housing 50. Two engagement slots 57 are formed near a bottom of each of the side surfaces 54.

Two elastic hooks 61 formed on a top of the hooking member 60 are inserted into the engagement slots 57 of the metal housing 50 to hook the metal housing 50. One hook 62 formed on a bottom of the hooking member 60 hooks a circuit board 70.

During the assembling processes, the main seat 31 of the plastic base is first placed into the metal housing 50 with the connection portions 33 of the main seat 31 exposed from the openings 56, and then the sub-seat 32 covers the rear end and bottom end of the main seat 31 so that the plastic base 30 is fixed in the metal housing 50.

Figure 5:
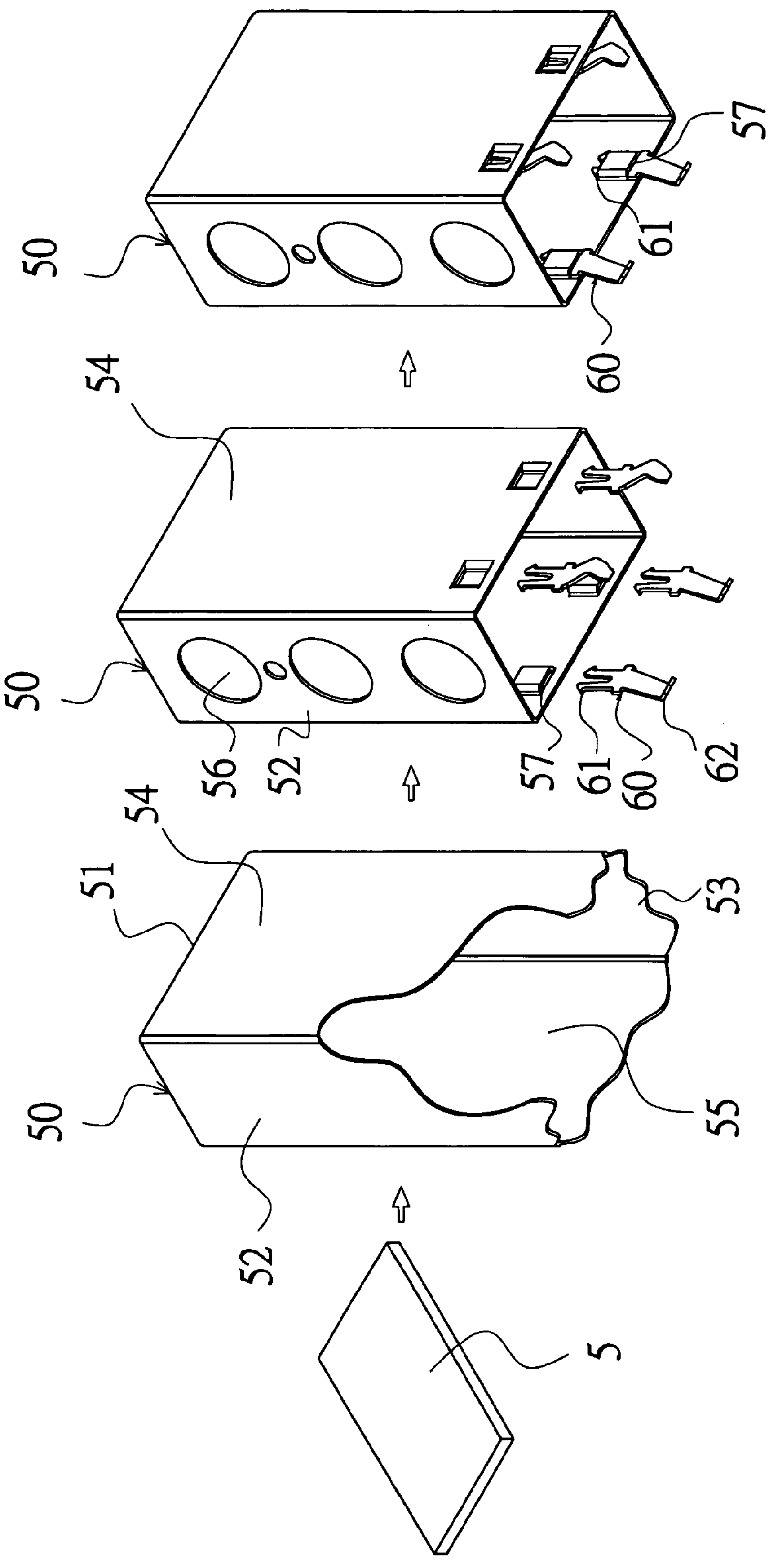
FIG. 5 is a schematic illustration showing processes for manufacturing the connector according to the first embodiment of the invention.

Referring to FIG. 5, the method for manufacturing the metal housing 50 includes the following steps.

First, a flat plate 5 made of an aluminum material is provided.

Next, the flat plate 5 is extruded upwards to form a metal housing 50. The housing 50 has a top surface 51, a front surface 52, a rear surface 53 and two side surfaces 54, all of which define a chamber 55 with an opened bottom end.

Then, the lower edges of the front surface 52, the rear surface 53 and the two side surfaces 54 are cut and flattened, three circular openings 56 are formed on the front surface 52, and two engagement slots 57 are formed near a bottom of the side surface 54 by way of pressing.

Next, a plurality of hooking members 60 is provided. A top of each hooking member 60 has two elastic hooks 61 to be inserted into the engagement slots 57 of the metal housing 50 to hook the metal housing 50, and a bottom of each hooking member 60 has a hook 62.

Then, the plurality of hooking members 60 is inserted into the engagement slots 57 of the metal housing 50 so that the two elastic hooks 61 hook the metal housing 50 at the engagement slots 57.

The connector of the invention has the following advantages.

First, no seam is formed between any two adjacent surfaces of the metal housing 50, so the better shielding effect can be achieved, the electrical interference may be reduced, and the overall appearance may be glorified.

Second, the metal housing 50 is formed by extruding a flat plate made of the aluminum material without any cutting, pressing, and bending processes, so no waste product is generated, no plating process has to be performed, and only the simple anode treatment has to be performed. Thus, the effects of saving the material, simplifying the processes and greatly reducing the manufacturing cost can be achieved.

Figure 6:
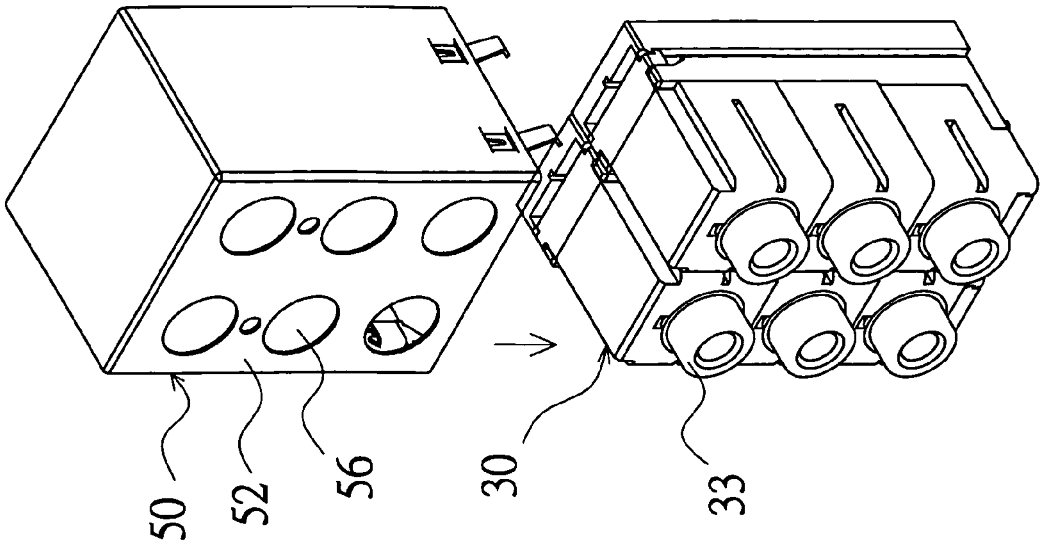
FIG. 6 is a pictorially exploded view showing a connector according to a second embodiment of the invention.

Referring to FIG. 6, the plastic base 30 has six connection portions 33 in the electrical connector (jack) of the second embodiment of the invention. The front surface 52 of the metal housing 50 is formed with six circular openings 56 corresponding to the six connection portions 33 of the plastic base 30.

Figure 7:
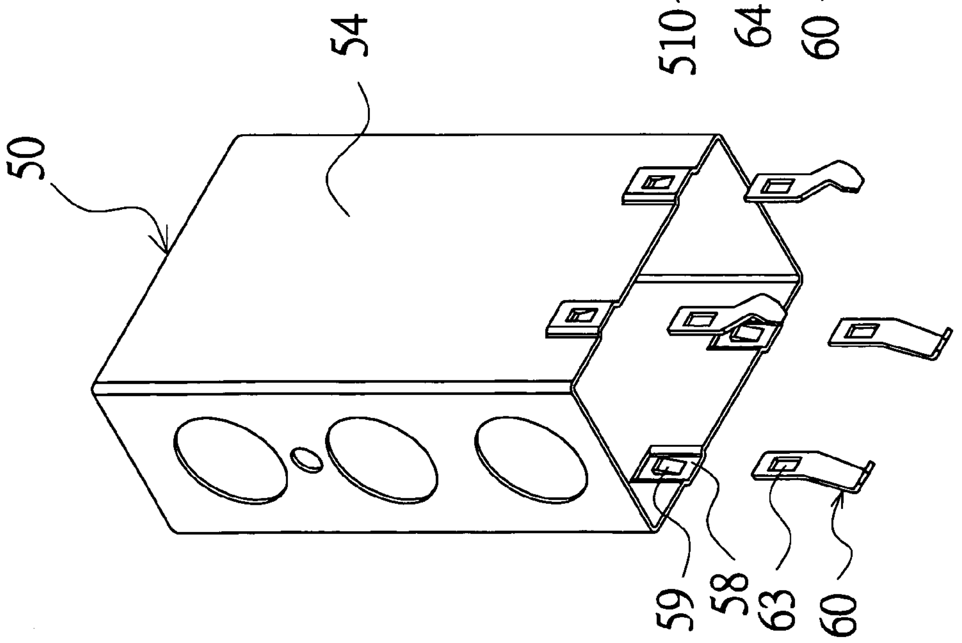
FIG. 7 is a pictorially exploded view showing a connector according to a third embodiment of the invention.

As shown in FIG. 7, two cavities 58 are formed near a bottom of each of the two side surfaces 54 of the metal housing 50 by way of pressing in the third embodiment of the invention. The middle of the cavity 58 is prodded to form an elastic engagement piece 59 extending upwards. The upper section of the hooking member 60 is engaged with the cavity 58, and an engagement hole 63 is formed near a top of the hooking member 60 such that the engagement hole 63 is engaged with the elastic engagement piece 59 of the metal housing 50.

Figure 8:
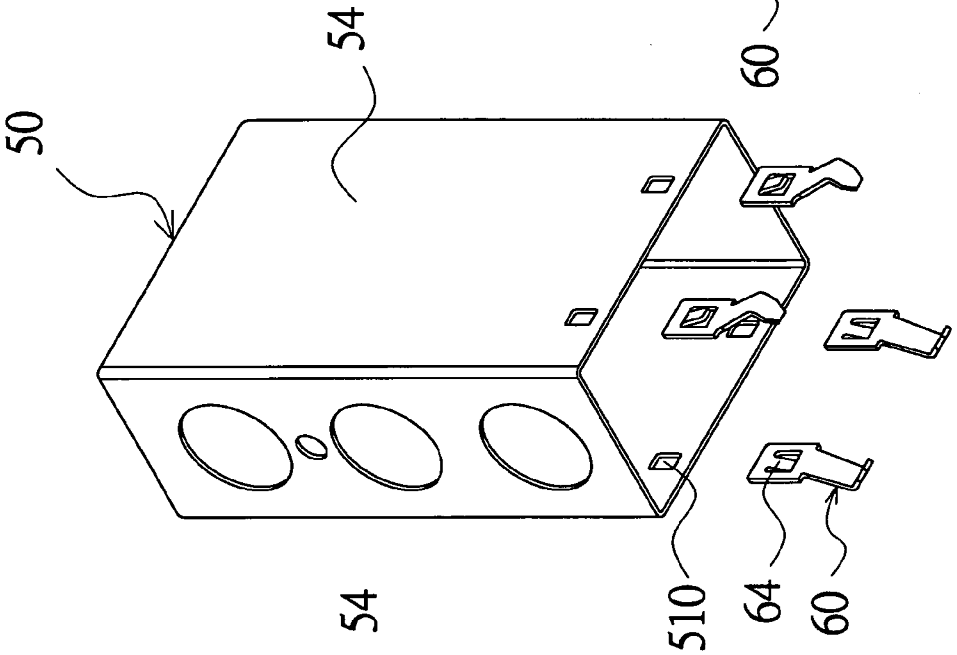
FIG. 8 is a pictorially exploded view showing a connector according to a fourth embodiment of the invention.

As shown in FIG. 8, two engagement holes 510 are formed near a bottom of each of the side surfaces 54 of the metal housing 50 by way of pressing in the fourth embodiment of the invention. An elastic engagement piece 64 is formed by way of prodding and pressing at a portion near the top of the hooking member 60. The elastic engagement piece 64 is engaged with the engagement hole 510 of the metal housing 50.

Figure 9:
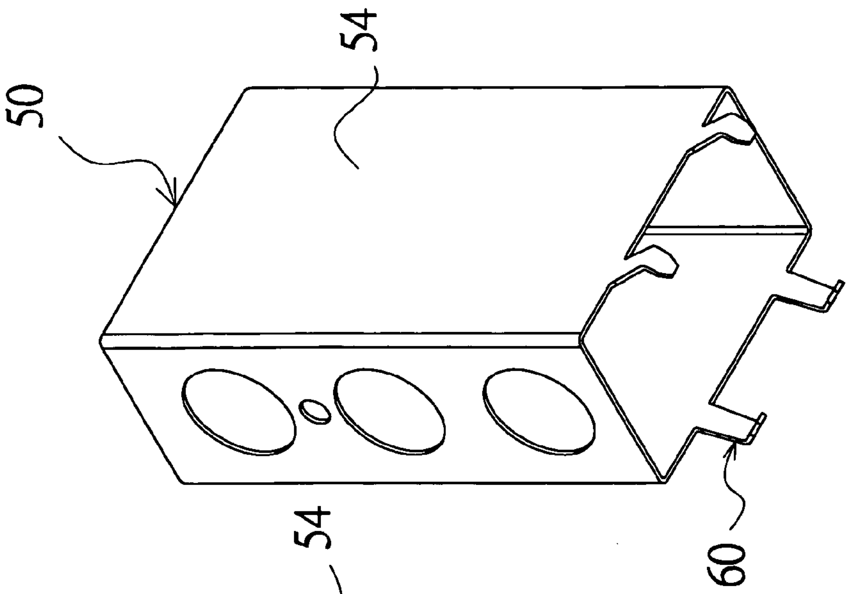
FIG. 9 is a pictorial view showing a connector according to a fifth embodiment of the invention.

As shown in FIG. 9, a lower section of the metal housing 50 is formed with a plurality of hooking members 60 connected to the bottom ends of the two side surfaces 54 by way of removing a portion of the two side surfaces 54 in the fifth embodiment of the invention.

Figure 10:
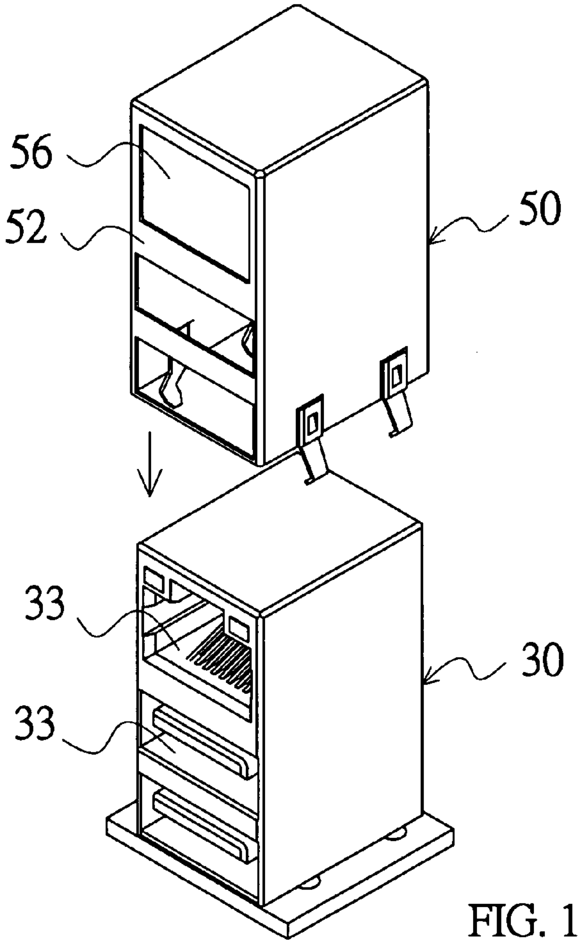
FIG. 10 is a pictorially exploded view showing a connector according to a sixth embodiment of the invention.
Figure 11:
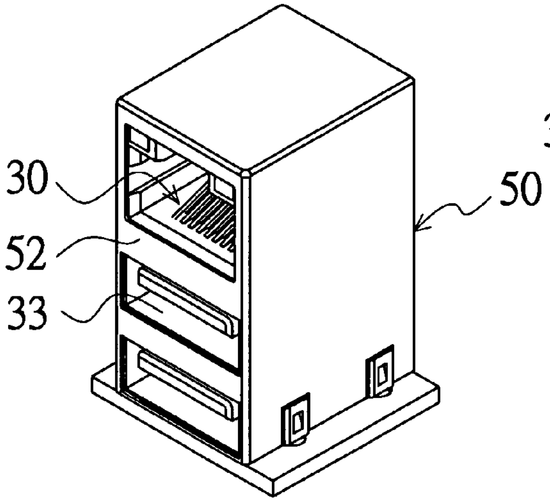
FIG. 11 is a pictorially assembled view showing the connector according the sixth embodiment of the invention.

As shown in FIGS. 10 and 11, the front surface 52 of the metal housing 50 has three rectangular openings 56, through which the three rectangular connection portions 33 of the plastic base 30 can be exposed, in another type of electrical connector (RJ45LED+USB) according to the sixth embodiment of the invention.

Figure 12:
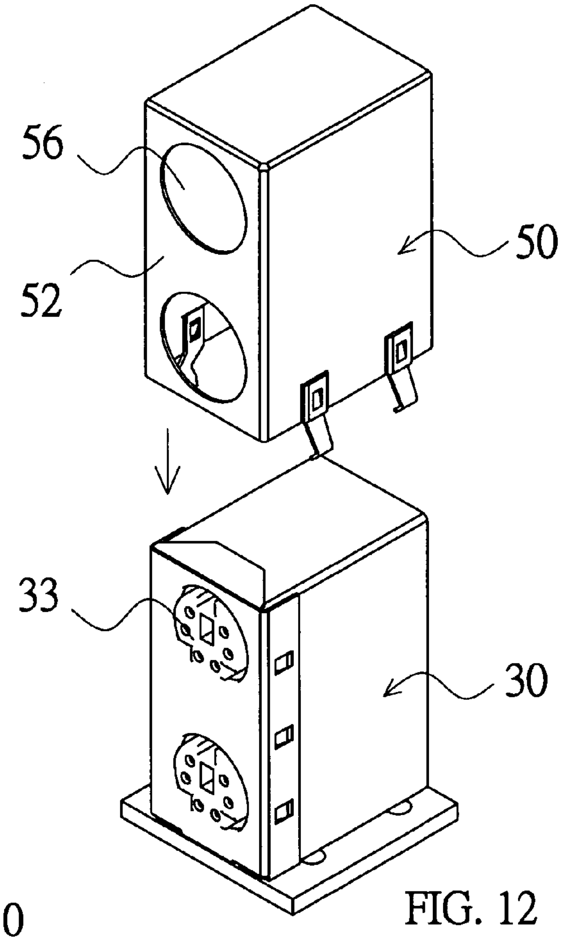
FIG. 12 is a pictorially exploded view showing a connector according to a seventh embodiment of the invention.
Figure 13:
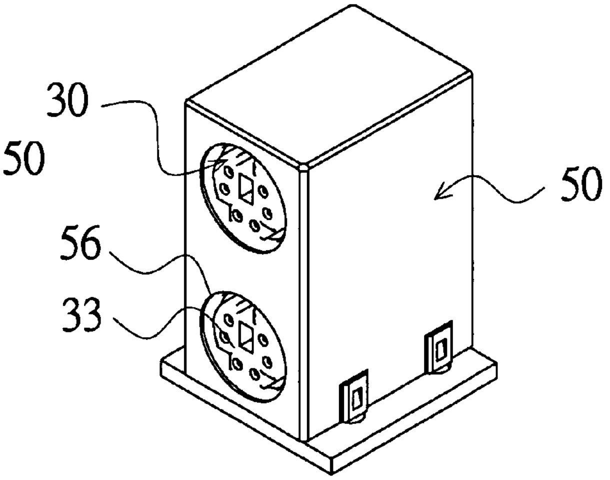
FIG. 13 is pictorially assembled view showing the connector according to the seventh embodiment of the invention.

As shown in FIGS. 12 and 13, the front surface 52 of the metal housing 50 is formed with two circular openings 56, through which the two circular connection portions 33 of the plastic base 30 can be exposed, in still another type of electrical connector (mini din) according to the seventh embodiment of the invention.

Figure 14:
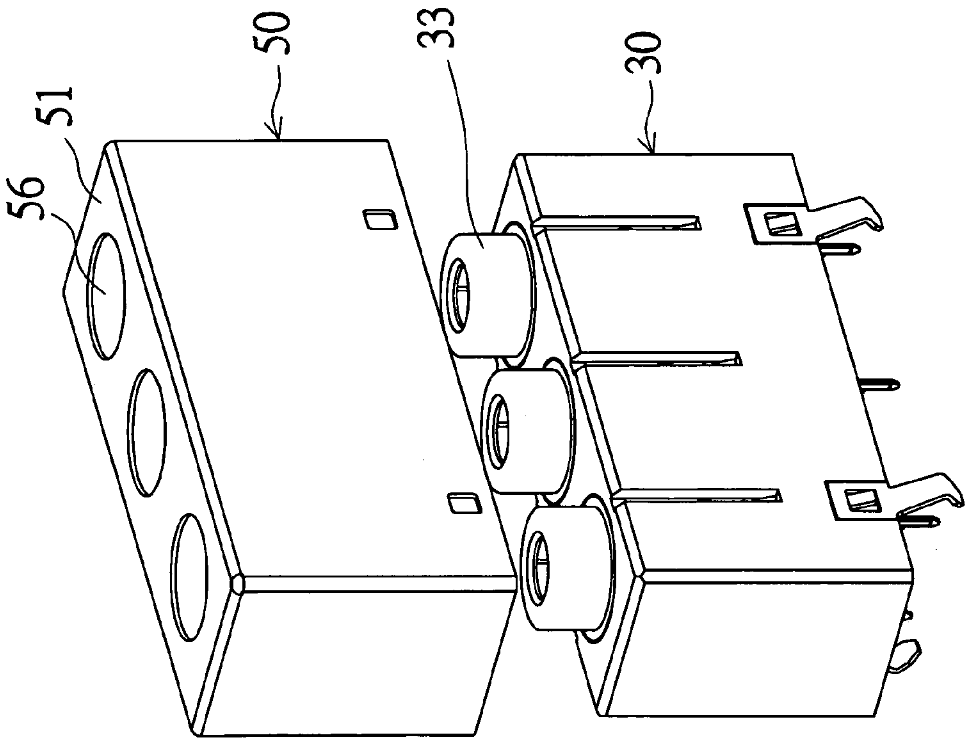
FIG. 14 is a pictorially exploded view showing a connector according to an eighth embodiment of the invention.

As shown in FIG. 14, the eighth embodiment of the invention is similar to the first embodiment except that the top surface 51 of the metal housing 50 is formed with three circular openings 56 such that the three circular connection portions 33 of the plastic base 30 can be exposed.

Figure 15:
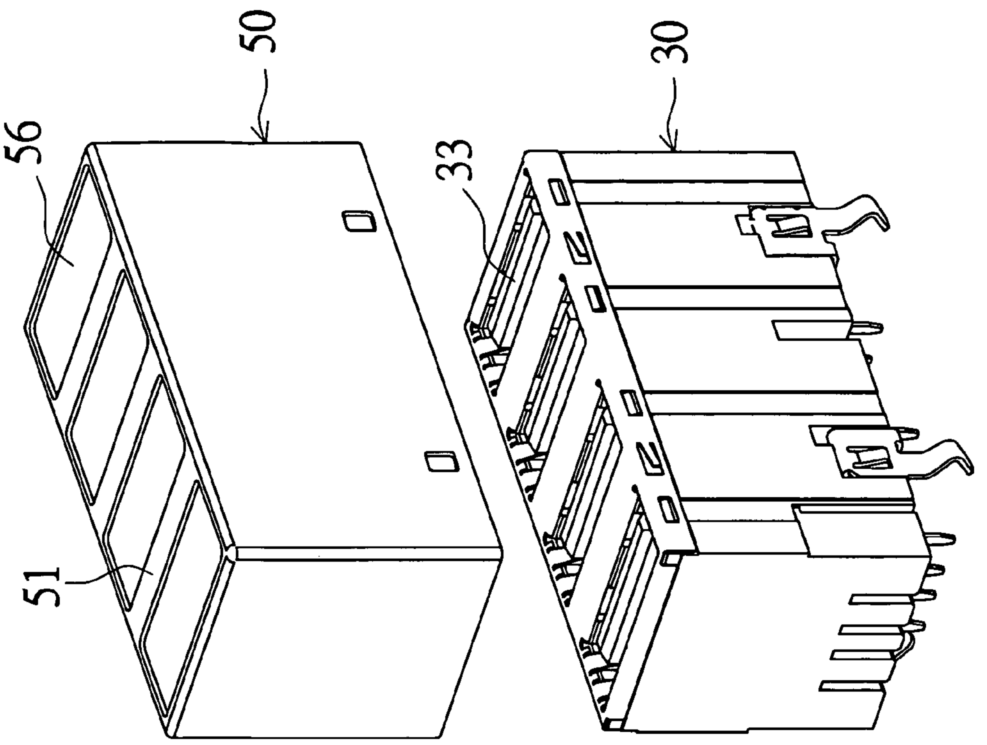
FIG. 15 is a pictorially exploded view showing a connector according to a ninth embodiment of the invention.

As shown in FIG. 15, the ninth embodiment of the invention is a four-layer USB connector and is similar to the eight embodiment except that four rectangular openings 56 are formed on the top surface 51 of the metal housing 50 such that the four rectangular connection portions 33 of the plastic base 30 can be exposed.

Using the extrusion technology to form the metal housing of the electrical connector can glorify the appearance, and reduce the electrical interference, the manufacturing cost and material cost.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a metal housing of an electrical connector, comprising the steps of:

providing a metallic flat plate;

extruding the flat plate to form a chamber, which has an opened bottom end and is defined by a top surface and a plurality of circumferential surfaces, wherein each of the plurality of circumferential surfaces is connected to two corresponding circumferential surfaces of the plurality of the circumferential surfaces to form a closed polygonal shape, and no seam is formed between any adjacent two surfaces among the top surface and the plurality of circumferential surfaces;

cutting and flattening lower edges of the circumferential surfaces; and forming an opening on at least one surface among the top surface and the circumferential surfaces.

2. The method according to claim 1, wherein a plurality of hooking members is formed on a bottom of each of the circumferential surfaces.

3. The method according to claim 2, wherein the circumferential surfaces are formed with engagement slots by way of pressing, and the hooking members are formed with elastic hooks to be inserted into and engaged with the engagement slots of the circumferential surfaces.

4. The method according to claim 2, wherein the hooking members are formed by removing a portion of the circumferential surfaces.

5. The method according to claim 2, wherein one of the circumferential surfaces is formed with a cavity, an elastic engagement piece is disposed in the cavity, an upper section of the hooking member is engaged with the cavity, and an engagement hole to be engaged with the elastic engagement piece of the circumferential surface is formed on the hooking member.

6. The method according to claim 2, wherein one of the circumferential surfaces is formed with an engagement hole, and one of the hooking members is pressed to form an elastic engagement piece to be engaged with the engagement hole of the circumferential surface.

7. The method according to claim 1, wherein the flat plate is made of an aluminum material.

* * * * *